United States Patent
Van Der Net et al.

(10) Patent No.: US 7,476,491 B2
(45) Date of Patent: Jan. 13, 2009

(54) LITHOGRAPHIC APPARATUS, GAS SUPPLY SYSTEM, METHOD FOR PURGING, AND DEVICE MANUFACTURING METHOD AND DEVICE MANUFACTURED THEREBY

(75) Inventors: Antonius Johannes Van Der Net, Tilburg (NL); Paul Van Der Veen, Waalre (NL); Yuri Johannes Gabriel Van De Vijver, Best (NL)

(73) Assignee: ASML Netherlands B.V., Veldhoven (NL)

( * ) Notice: Subject to any disclaimer, the term of this patent is extended or adjusted under 35 U.S.C. 154(b) by 743 days.

(21) Appl. No.: 10/941,017

(22) Filed: Sep. 15, 2004

(65) Prior Publication Data
US 2006/0055900 A1 Mar. 16, 2006

(51) Int. Cl.
*G03F 7/20* (2006.01)

(52) U.S. Cl. .................. 430/302; 430/311; 355/30; 355/53

(58) Field of Classification Search .......... 430/302, 430/311; 250/492.2; 355/67, 30, 53
See application file for complete search history.

(56) References Cited

U.S. PATENT DOCUMENTS 6,003,526 A * 12/1999 Lo et al. ................ 134/1.1
6,833,903 B2 * 12/2004 Kamono ................ 355/30

FOREIGN PATENT DOCUMENTS

| EP | 1 312 984 A2 | 5/2003 |
| EP | 1 312 984 A3 | 5/2005 |
| EP | 1 312 984 B1 | 3/2007 |
| WO | WO99/57596 | 11/1999 |

\* cited by examiner

*Primary Examiner*—Thorl Chea
(74) *Attorney, Agent, or Firm*—Sterne, Kessler, Goldstein & Fox P.L.L.C.

(57) ABSTRACT

A lithographic apparatus includes an illumination system for providing beam of radiation, and a support structure for supporting a patterning device. The patterning device imparts the beam of radiation with a pattern. The apparatus also includes a substrate table for holding a substrate, a projection system for projecting the patterned beam onto a target portion of the substrate, and a gas supply system for supplying a purge gas including oxygen to a plurality of spaces in the apparatus. The gas supply system is arranged so that the purge gas supplied to each of the plurality of spaces is a premixed purge gas mixture composed by the gas supply system for each of the plurality of spaces on the basis of a predetermined relationship that relates a desired amount of oxygen in the premixed purge gas mixture to the respective space to which that premixed purge gas mixture is supplied.

10 Claims, 4 Drawing Sheets

LITHOGRAPHIC APPARATUS, GAS SUPPLY SYSTEM, METHOD FOR PURGING, AND DEVICE MANUFACTURING METHOD AND DEVICE MANUFACTURED THEREBY

FIELD

The present invention relates to a lithographic apparatus, a gas supply system, a method for purging, and a device manufacturing method and a device manufactured by the device manufacturing method.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, than the whole procedure, or a variant thereof, will have to be repeated for each new layer. Eventually, an array of devices will be present on the substrate (wafer). These devices are then separated from one another by a technique such as dicing or sawing, so that the individual devices can be mounted on a carrier, connected to pins, etc. Further information regarding such processes can be obtained, for example, from the book "Microchip Fabrication: A practical Guide to Semiconductor Processing", Third Edition, by Peter van Zant, McGraw Hill Publishing Co., 1997, ISBN 0-07-067250-4, incorporated herein by reference.

To reduce the size of features that can be imaged using a lithographic projection apparatus, it is desirable to reduce the wavelength of the illumination radiation. Ultraviolet wavelengths of less than 200 nm are therefore currently contemplated, for example 193 nm, 157 nm, or 126 nm. Also contemplated are extreme ultraviolet (EUV) wavelengths of less than 50 nm, for example, 13.5 nm. Suitable sources of UV radiation include Hg lamps and excimer lasers. EUV sources contemplated include laser-produced plasma sources, discharge sources, and undulators or wigglers provided around the path of an electron beam in a storage ring or synchrotron.

In the case of EUV radiation, the projection system will generally consist of an array of mirrors, and the mask will be reflective. See, for example, the apparatus discussed in WO 99/57596, incorporated herein by reference.

Apparatus which operate at such low wavelengths are significantly more sensitive to the presence of contaminant particles than those operating at higher wavelengths.

Contaminant particles such as hydrocarbon molecules and water vapor may be introduced into the system from external sources, or they may be generated within the lithographic apparatus itself. For example, the contaminant particles may include the debris and by-products that are liberated from the substrate, for example, by an EUV radiation beam, or molecules produced through evaporation of plastics, adhesives, and lubricants used in the apparatus. It will be clear that the term "contaminant particles" encompasses molecular contamination.

These contaminants tend to adsorb to optical components in the system, and cause a loss in transmission of the radiation beam. When using, for example, 157 nm radiation, a loss in transmission of about 1% is observed when only one or a few monolayers of contaminant particles form on each optical surface. Such a loss in transmission is unacceptably high. Further, the uniformity requirement on the projection beam intensity for such systems is generally less than 0.2%. Localized contamination on optical components can cause this requirement not to be met.

EP 1312984, incorporated herein by reference, describes that the cleaning of optical components in a lithographic projection apparatus can be carried out by addition of relatively low partial pressures of stable molecular oxygen to a purge gas which is fed to spaces through which the projection beam travels. As molecular oxygen itself is not effective as cleaning agent, it is used in combination with (E)UV radiation. The (E)UV radiation cracks oxygen to produce oxygen radicals, which are highly effective cleaning agents. With the low concentrations of cleaning agent in the purge gas, the optical components can be cleaned while projecting a mask pattern onto a target portion with acceptable transmission loss due to absorption of (E)UV radiation by oxygen.

After this form of cleaning, the transmission or reflection of the radiation beam is noticeably better than before cleaning. The uniformity has also improved. This form of cleaning is regarded as a highly effective method of cleaning optical components in lithographic projection apparatus. It avoids the use of unstable materials such as ozone. Above all, it prevents very time-consuming dismounting of optical components (e.g. lens elements) out of the lithographic projection apparatus in order to clean the component in a separate cleaning unit.

SUMMARY

It is an aspect of the present invention to provide a lithographic apparatus allowing for even more efficient and improved cleaning of the optical components.

According to an aspect of the invention, there is provided a lithographic apparatus that includes an illumination system for providing a beam of radiation, and a support structure for supporting a patterning device. The patterning device serves to impart the beam of radiation with a pattern in its cross-section. The apparatus also includes a substrate table for holding a substrate, a projection system for projecting the patterned beam onto a target portion of the substrate, and a gas supply system for supplying a purge gas that includes oxygen to a plurality of spaces in the apparatus. The gas supply system is arranged so that the purge gas that is supplied to each of the plurality of spaces is a premixed purge gas mixture composed by the gas supply system for each of the plurality of spaces on the basis of a predetermined relationship that relates a desired amount of oxygen in the premixed purge gas mixture to the respective space to which that premixed purge gas mixture is supplied.

With a lithographic apparatus according to the invention, it is possible to provide each space individually with an amount of oxygen which has for the respective space been found to provide good cleaning and/or prevention of interaction between contaminant particles and optical components. The amount of oxygen in each premixed purge gas mixture may be made specific for the space to which the premixed purge gas mixture is supplied. This is advantageous as each space may be exposed to a different level of contamination. Also, the sensitivity of the optical components to contamination may vary through the lithographic apparatus. In cases where the purging coincides with the presence of an (E)UV projection beam, the intensity of the (E)UV beams in a particular space may be accounted for. These space related circumstances give rise to predetermined relationships which are for each space, or only some of them different from the predetermined relationships for any of the other spaces.

By optimizing the amount of oxygen supplied to each space, a more efficient purging and hence more efficient lithographic apparatus may be obtained. The life time of the optical or other components may also be extended, thereby reducing down-time of the apparatus and operational costs.

In an embodiment of an apparatus according to the invention, the gas supply system is further arranged so that for at least one of the plurality of spaces, the premixed purge gas mixture is composable on the basis of a time-related process parameter. This may have the advantage that oxygen may, in an apparatus according to the invention, be supplied to a space depending on the actual "need" for oxygen at that time. This "need" may be determined experimentally. It may, for example, be known that hydrocarbons will only be released in respect to a space after a certain fraction of the exposure time, as only after that fraction the space has been heated up to a level which corresponds with release of hydrocarbons. Only after that fraction of time, it becomes necessary to supply oxygen to the respective space. Another advantage of a lithographic apparatus according to the invention is that it allows for the possibility of cleaning separate spaces successively, each at a time, so that the (E)UV beam is not reduced in intensity by spaces with oxygen "upstream" of the space to be cleaned. This allows for optimal use of the (E)UV beam, which also reduces the time required for cleaning.

In an embodiment of a lithographic apparatus according to the invention, the lithographic apparatus has a plurality of functional modes. The plurality of functional modes include an operative mode and a maintenance mode. The gas supply system is arranged so that at a particular moment for at least one of the plurality of spaces, the composition of the premixed purge gas mixture is based on the functional mode the apparatus has adapted to at that particular moment. This embodiment may have the advantage that during maintenance, when no particular requirements apply as to the transmission or reflection of the radiation beam, more oxygen may be supplied to a respective space in order to more thoroughly clean the optical components. When the lithographic apparatus has adapted to an operative mode, much less oxygen may be supplied to the respective space as to only prevent, for example, interaction of hydrocarbons with the surface of, for example, optical components, without unacceptable loss in reflection or transmission of the radiation beam. It is also possible that the oxygen supply, i.e. the composition of a premixed purge gas mixture, is within a functional mode dependent on a time-related process parameter. For example, after exposing a space to air due to replacement of optics, more intense cleaning, and thus more oxygen, may be required to remove contaminants.

In an embodiment of a lithographic apparatus according to the invention, the gas supply system includes at least one purifier for purifying a supply of a first gas which is to be mixed with at least a second gas for obtaining at least one of the premixed purge gas mixtures. By purifying at least one of the gasses, it is possible to provide a premixed purge gas mixture with a more accurate composition. In practice, the purifier may be arranged to remove oxygen from, for example, nitrogen, which is then to be mixed with a gas including an accurately known amount of oxygen.

In an embodiment of a lithographic apparatus according to the invention, the gas supply system includes at least one mixer for obtaining at least one of the premixed purge gas mixtures. In this embodiment, it is possible that one mixer supplies successively for each space a premixed purge gas mixture.

In an embodiment of a lithographic apparatus according to the invention the gas supply system includes for each space, a mixer for obtaining the premixed purge gas mixture that has to be supplied to the respective space. In this embodiment, the mixers simultaneously prepare the premixed purge gas mixture and may simultaneously supply each space with a premixed purge gas mixture.

In an embodiment of a lithographic apparatus according to the invention, the gas supply system includes in at least one of the plurality of spaces a purge gas remover for removing the purge gas. In this embodiment, the amount of oxygen present in a space may be better controlled, and build-up of oxygen in a certain space may be less likely to occur, as compared to a lithographic apparatus in which no purge gas remover is placed. This may further allow for local control of the amount of oxygen at places where it is needed. The remover should be placed so as to prevent the oxygen to arrive at positions where it will not be involved in cleaning and where it will thus only have a detrimental effect on the uniformity and/or intensity of the projection beam rather than having a beneficial effect on the cleaning.

In an embodiment of a lithographic apparatus according to the invention, each space corresponds to at least one optical component. In other words, a space is related to an optical component or a group of optical components. Such an embodiment will be shown and discussed below. This embodiment may have the advantage that the actual supply of oxygen may be controlled in relation to the local nature of the interaction between oxygen, hydrocarbons, and the optical component.

In an embodiment of a lithographic apparatus according to the invention, each space corresponds to a compartment of the lithographic apparatus. In this embodiment, a supply of oxygen may be related to the overall processes occurring in that compartment.

In an embodiment of a lithographic apparatus according to the invention, the gas supply system is arranged to produce ozone as part of at least one of the premixed purge gas mixtures. This embodiment may have the advantage that cleaning of the optical components may also occur when no further radiation provided by the radiation beam is present in the space to which the premixed purge gas mixture is supplied. This may also allow for an embodiment of a lithographic apparatus that does not produce a projection beam of radiation that causes the production of ozone when radiation passes through purge gas.

According to an aspect of the invention, there is provided a gas supply system for supplying a purge gas that includes oxygen to a plurality of spaces in a lithographic apparatus. The gas supply system is arranged so that the purge gas, which is supplied to each of the plurality of spaces, is a premixed purge gas mixture composed by the gas supply system for each of the plurality of spaces on the basis of a predetermined relationship that relates a desired amount of oxygen in the premixed purge gas mixture to the respective space to which that premixed purge gas mixture is supplied.

According to an aspect of the invention, there is provided a method of purging a plurality of spaces in a lithographic apparatus with an oxygen containing gas. The method includes composing for each space a premixed purge gas mixture with an oxygen amount substantially in accordance with a predetermined relationship that relates a desired amount of oxygen in the premixed purge gas mixture to the respective space to which that premixed purge gas mixture is to be supplied, and supplying to each of the plurality of spaces the premixed purge gas mixture as composed for the respective space to which that premixed purge gas mixture is supplied.

According to an aspect of the invention, there is provided a device manufacturing method that includes providing a substrate, providing a projection beam of radiation using an illumination system, using a patterning device to impart the projection beam with a pattern in its cross-section, and projecting the patterned beam of radiation onto a target portion of the substrate. The method also includes purging a plurality of spaces in the lithographic apparatus with an oxygen containing gas, composing for each space a premixed purge gas mixture with an oxygen amount substantially in accordance with a predetermined relationship that relates a desired amount of oxygen in the premixed purge gas mixture to the respective space to which that premixed purge gas mixture is to be supplied, and supplying to each of the plurality of spaces the premixed purge gas mixture as composed for the respective space to which that premixed purge gas mixture is supplied.

According to an aspect of the invention, there is provided a device manufacturing method for a lithographic apparatus. The method includes patterning a beam of radiation with a patterning device, projecting the patterned beam of radiation onto a target portion of a substrate, purging a plurality of spaces in the lithographic apparatus with an oxygen containing gas, composing for each space a premixed purge gas mixture with an oxygen amount substantially in accordance with a predetermined relationship that relates a desired amount of oxygen in the premixed purge gas mixture to the respective space to which that premixed purge gas mixture is to be supplied, and supplying to each of the plurality of spaces the premixed purge gas mixture as composed for the respective space to which that premixed purge gas mixture is supplied.

According to an aspect of the invention, there is provided a device manufactured according to the above described device manufacturing method and/or by the above described lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

The terms "radiation" and "beam" as used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
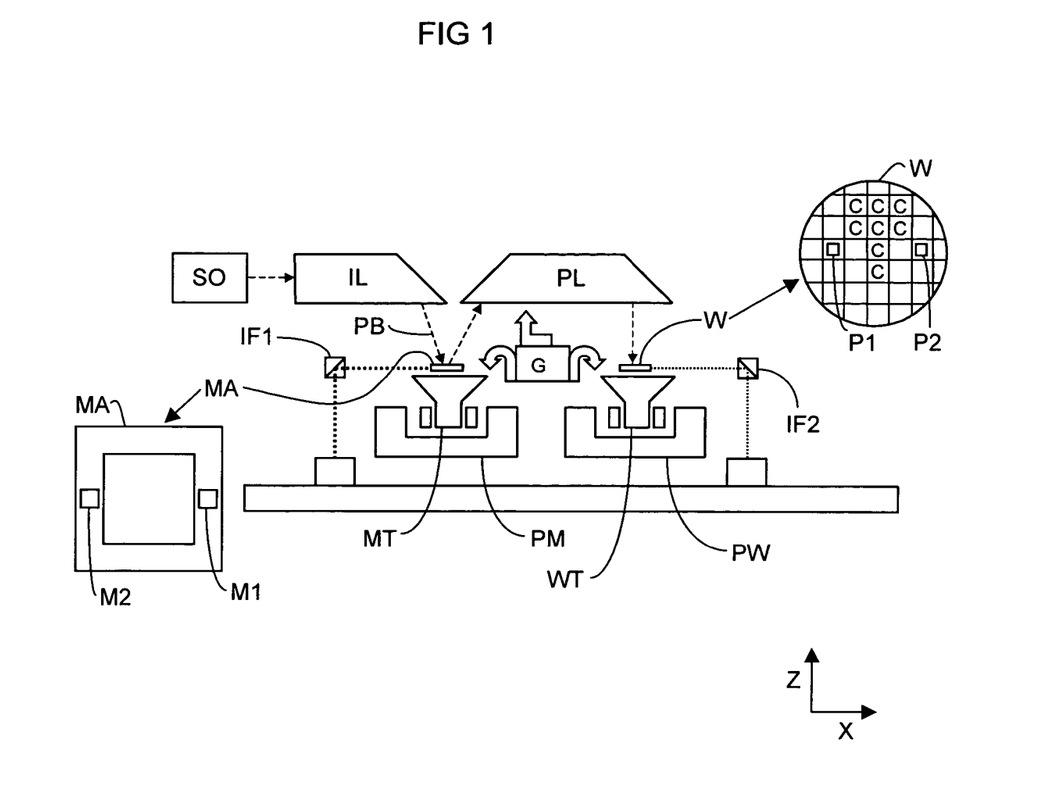
FIG. 1 depicts a lithographic apparatus according to an embodiment of the invention.

FIG. 1 schematically depicts a lithographic apparatus according to a particular embodiment of the invention. The apparatus includes an illumination system (illuminator) IL for providing a projection beam PB of radiation (e.g. UV radiation or EUV radiation), a first support structure (e.g. a mask table) MT for supporting a patterning device (e.g. a mask) MA and connected to a first positioning device PM for accurately positioning the patterning device with respect to item PL, a substrate table (e.g. a wafer table) WT for holding a substrate (e.g. a resist-coated wafer) W and connected to a second positioning device PW for accurately positioning the substrate with respect to item PL, a projection system (e.g. a refractive projection lens) PL for imaging a pattern imparted to the projection beam PB by the patterning device MA onto a target portion C (e.g. including one or more dies) of the substrate W, and a gas supply system G for supplying a purge gas that includes oxygen to a plurality of spaces in the apparatus.

As here depicted, the apparatus is of a reflective type (e.g. employing a reflective mask, like e.g. a programmable mirror array of a type as referred to above). Alternatively, the apparatus may be of a transmissive type (e.g. employing a transmissive mask).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system including, for example, suitable directing mirrors and/or a beam expander. In other cases, the source may be integral part of the apparatus, for example, when the source is a mercury lamp. The source SO and the illuminator IL, together with the beam delivery system, if required, may be referred to as a radiation system.

The illuminator IL may include an adjusting device for adjusting the angular intensity distribution of the beam. Generally, at least the outer and/or inner radial extent (commonly referred to as σ-outer and σ-inner, respectively) of the intensity distribution in a pupil plane of the illuminator can be adjusted. In addition, the illuminator IL generally includes various other components, such as an integrator and a condenser. The illuminator provides a conditioned beam of radiation, referred to as the projection beam PB, having a desired uniformity and intensity distribution in its cross-section.

The projection beam PB is incident on the patterning device MA, which is held on the support structure MT. Having traversed the patterning device MA, the projection beam PB passes through the lens PL, which focuses the beam onto a target portion C of the substrate W. With the aid of the second positioning device PW and position sensor IF2 (e.g. an interferometric device), the substrate table WT can be moved accurately, e.g. so as to position different target portions C in the path of the beam PB. Similarly, the first positioning device PM and another position sensor IF1 can be used to accurately position the patterning device MA with respect to the path of the beam PB, e.g. after mechanical retrieval from a mask library, or during a scan. In general, movement of the support structure MT and the substrate table WT will be realized with the aid of a long-stroke module (coarse positioning) and a short-stroke module (fine positioning), which form part of the positioning devices PM and PW. However, in the case of a stepper (as opposed to a scanner) the support structure MT may be connected to a short stroke actuator only, or may be fixed. The patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the projection beam is projected onto a target portion C (i.e. a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

As discussed above, the lithographic apparatus shown in FIG. 1 includes a gas supply system G for supplying a purge gas that includes oxygen to a plurality of spaces in the apparatus. The supply of gas to these spaces is schematically indicated by the open arrows. Each of these spaces contains at least one optical component positioned to interact with the projection beam when the apparatus is in use. The gas supply system may be arranged to supply many spaces with a purge gas including oxygen.

Figure 2:
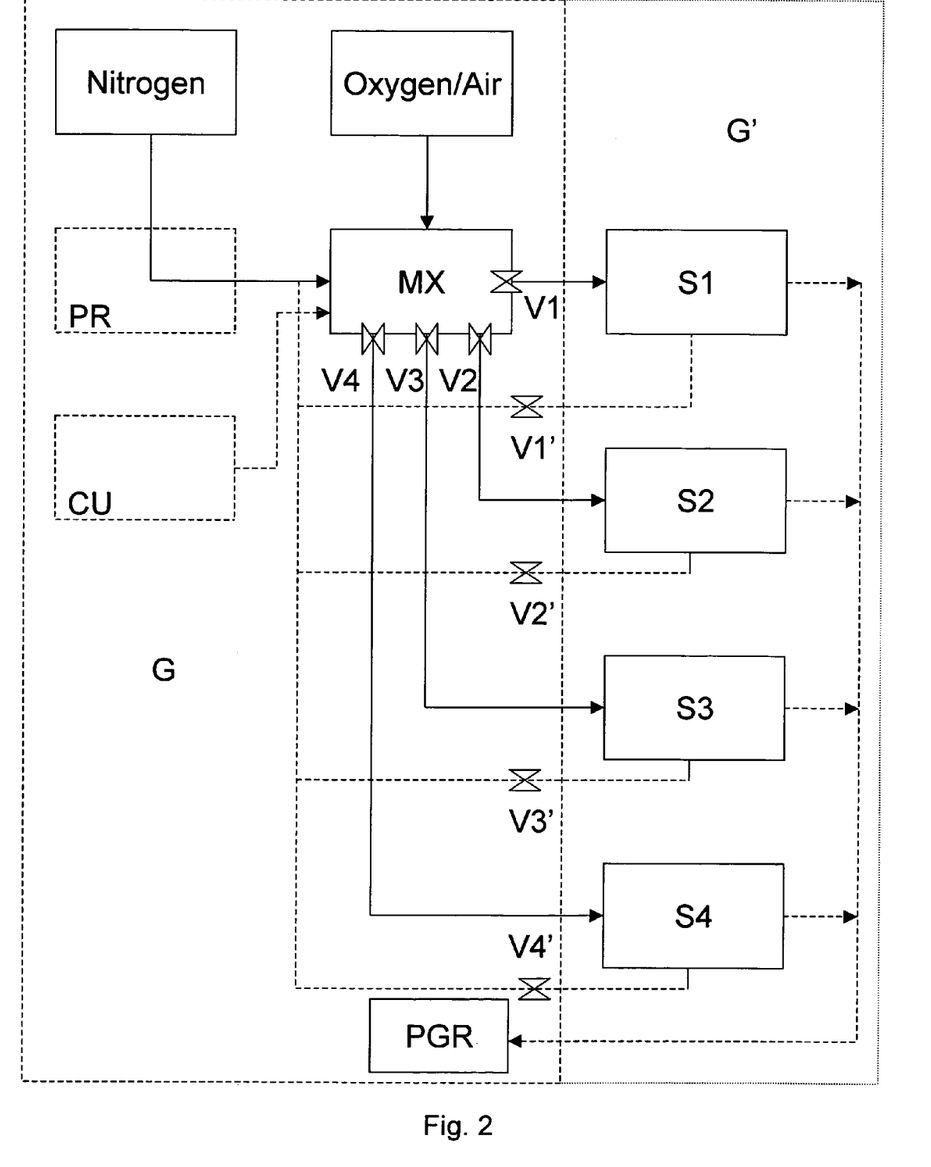
FIG. 2 depicts schematically a part of the lithographic apparatus of FIG. 1 according to an embodiment of the invention.

FIG. 2 depicts schematically a gas supply system G for supplying a purge gas that includes oxygen to a plurality of spaces in the lithographic apparatus. FIG. 2 shows four spaces S1, S2, S3, S4 to which the gas supply system G supplies the purge gas that includes oxygen. Although not shown in FIG. 2, each of these spaces S1, S2, S3, S4 may contain at least one optical component positioned to interact with the projection beam when the apparatus is in use. The gas supply system G is further arranged so that the purge gas which is supplied to each of the spaces S1, S2, S3, S4 is a premixed purge gas mixture composed by the gas supply system G for each of the spaces S1, S2, S3, S4 on the basis of predetermined relationship. Each of these relationships relates a desired amount of oxygen in the premixed purge gas mixture to the respective space to which that premixed purge gas mixture is meant to be supplied. The gas supply system G includes at least one purifier PR for purifying the supply of a first gas, for example, nitrogen, which is to be mixed with at least a second gas, for example, oxygen/air, for obtaining at least one the premixed purge gas mixtures. The purifier PR may, for example, remove oxygen from the nitrogen so that once oxygen is deliberately added to the purified nitrogen, the oxygen content in the purge gas is accurately known. The gas supply system G as shown in FIG. 2 includes one mixer MX for obtaining at least one of the premixed purge gas mixtures. If all the spaces S1, S2, S3, S4 need to be supplied by the same premixed purge gas mixture, i.e., when the mixtures all have the same composition, the mixer MX may supply the purge gas to all the spaces S1, S2, S3, S4 at the same time. The mixture MX may than open all valves V1, V2, V3, V4 allowing a flow of the premixed purge gas mixture to each of the spaces S1, S2, S3, S4.

An embodiment of the gas supply system G as shown in FIG. 2 may further be arranged so that for at least one of the plurality of spaces, the premixed purge gas mixture may be composable on the basis of time-related process parameter. In that case, the gas supply system may include a control unit CU for controlling the mixer MX so as to ensure that the required premixed purge gas mixture is composed for a space, for example, space S3, and that only valve V3 will be opened, thereby allowing for a flow of the composed premixed purge gas mixture towards space S3. In that case, valves V1', V2' and V4' may be opened so that spaces S1, S2 and S4 are supplied with a purge gas of (purified) nitrogen. Valve V3' will then be shut. It will be clear that if all spaces S1, S2, S3, S4 should, according to the respective predetermined relationships, be supplied with a purge gas mixture having an amount of oxygen that is different from the amount of oxygen in any of the other purge gas mixtures, the mixer MX may successively compose each premixed purge gas mixture and only successively supply each space S1, S2, S3, S4 with the required premixed purge gas mixture.

It will be clear that an embodiment as shown in FIG. 2 may be arranged so that at any time each of the spaces is supplied with a purge gas. The purge gas may either be an oxygen containing premixed purge gas mixture, or a purge gas of (purified) nitrogen.

The lithographic apparatus according to the invention may have a plurality of functional modes. One functional mode may be, for example, an operative mode and another functional mode may be, for example, a maintenance mode. The gas supply system may further be arranged so that at a particular moment for one of the spaces S1, S2, S3, S4, the compositions of the premixed purge gas mixture is based on the functional mode that the apparatus has adapted to at that particular moment.

It is possible that the gas supply system G includes a purge gas remover PGR for removing the purge gas from at least one of the spaces S1, S2, S3, S4. It should be noted that each space may correspond to at least one optical component. It is also possible that each space corresponds to one compartment of the lithographic apparatus. Although the purge gas system G may be regarded as a system that does not include the spaces to which the premixed purge gas mixtures are supplied, it is also possible to regard the gas supply system as a system which does include the spaces to which the premixed purge gas mixtures are supplied. In that case, the purge gas supply system includes a system schematically shown by box G and box G' together, as indicated in FIG. 2.

Figure 3:
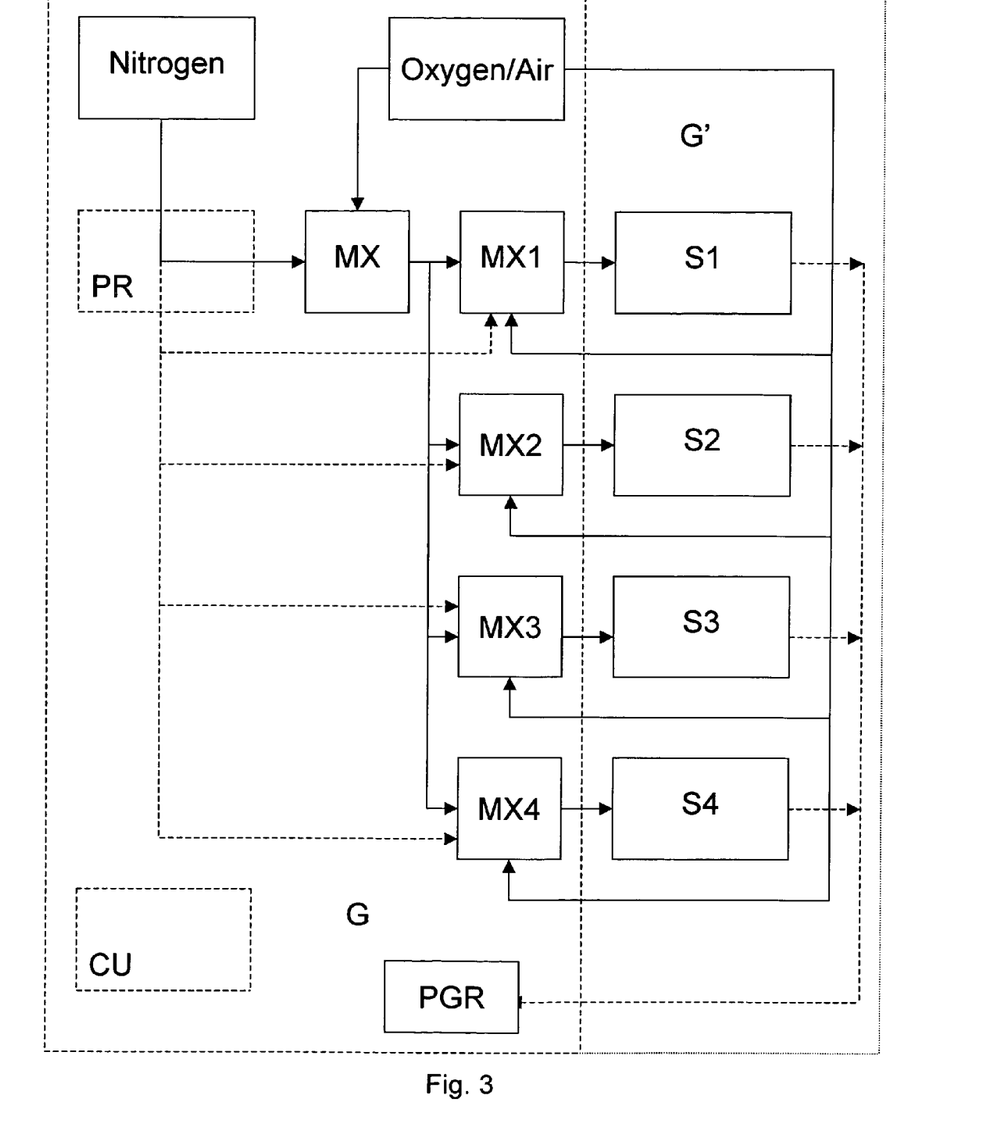
FIG. 3 depicts schematically a part of the lithographic apparatus of FIG. 1 according to another embodiment of the invention.

FIG. 3 schematically shows a part of a lithographic apparatus according to another embodiment of the invention. In this embodiment, the gas supply system G includes for each space S1, S2, S3, S4, a mixer MX1, MX2, MX3, MX4, respectively, for obtaining the premixed purge gas mixture that is to be supplied to the respective space. Each mixer MX1, MX2, MX3, MX4 may be supplied by, for example, nitrogen, which may have been purified by purifier PR and a mixture of oxygen/air, oxygen/nitrogen or only oxygen or only air.

It is, however, possible that mixer MX provides first a mixture of nitrogen, preferably purified, and oxygen/air. This mixture may then be supplied to each mixer MX1, MX2, MX3, MX4, and oxygen may further be supplied to each mixer MX1, MX2, MX3, MX4 in accordance with the predetermined relationships. This embodiment may further work like the embodiment shown in FIG. 2. Also, in this embodiment, the gas supply system G may include a control unit CU for controlling the supplies and compositions of each flow of gas. Also, in this embodiment, the system may include a purge gas remover PGR. Again, the system may be considered to include all the components shown in box G. It is, however, also possible that the gas supply system may include all the components shown in the total of box G and box G'.

Figure 4:
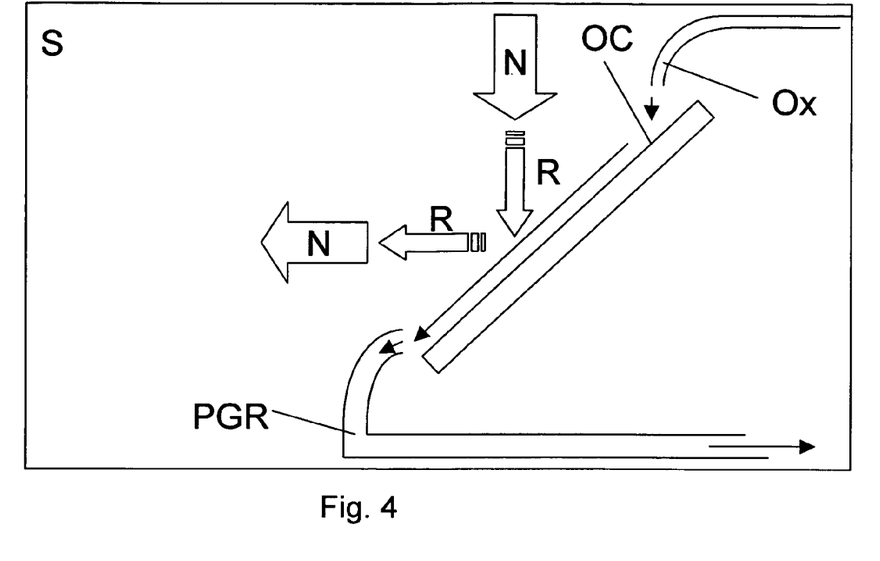
FIG. 4 depicts schematically another part of the lithographic apparatus of FIG. 1 according to an embodiment of the invention.

FIG. 4 shows a more detailed part of a lithographic apparatus according to an embodiment of the invention. Space S includes an optical component OC that is positioned to interact with the projection beam when the apparatus is in use. A purge gas that includes oxygen Ox may be supplied to the optical component such that the purge gas will flow along the surface of the optical component OC. Downstream of this flow of gas, a purge gas remover PGR may be positioned to remove the purge gas. In this embodiment, the purge gas includes oxygen that is mainly supplied where it is likely to have a beneficial effect, e.g., prevention of interaction of contaminant particles with the optical component OC, rather than supplying it at positions where only a detrimental effect, e.g., absorption by the projection beam leading to a drop intensity of the production beam, may take place. It may be advantageous to also supply a nitrogen gas flow N such that the nitrogen gas flow N coincides with the course of the projection beam R. It should be noted that a space S as shown in FIG. 4 may also include a group of optical components. It should further be noted that a space S may correspond to a compartment of the lithographic apparatus.

Figure 5:
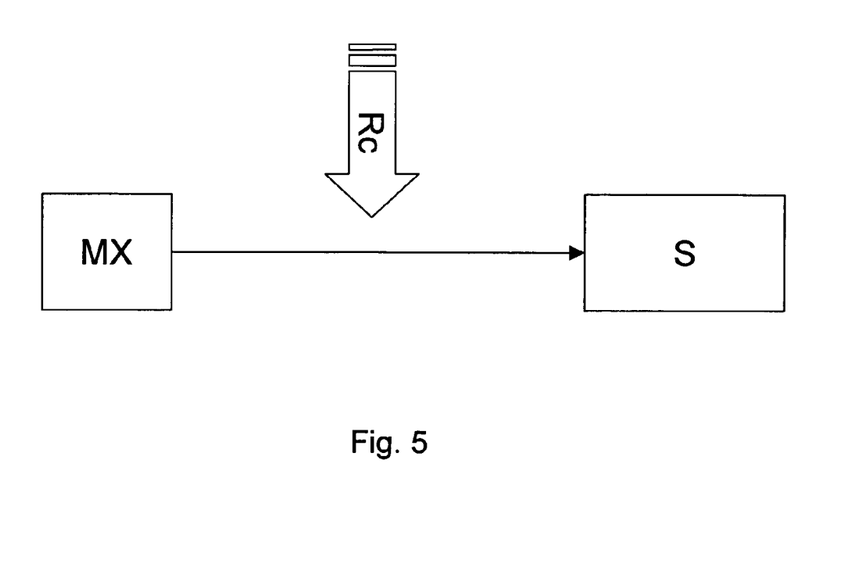
FIG. 5 depicts schematically a part of the lithographic apparatus of FIG. 1 according to an embodiment of the invention.

FIG. 5 depicts schematically another part of a lithographic apparatus according to an embodiment of the invention. This embodiment is arranged so that a flow of purge gas from a mixer MX to a space S is exposed to a form of radiation Rc which causes cracking of the oxygen containing gas components leading to production of ozone in this flow of purge gas. This embodiment may be useful in lithographic apparatus that use a projection beam with radiation having wavelengths that are not suitable for cracking the oxygen containing gas particles. In this embodiment, the radiation Rc will crack the oxygen containing components in the purge gas so that ozone may be produced and supplied to the respective space.

Although the embodiment shown in FIGS. 2 and 3 refer to four spaces and four mixtures, any number n of spaces could have been chosen, as long as n is equal or larger than two. The same applies to the number of mixers in addition to mixer MX.

It should further be understood that spaces referred to in this specification may or may not contain at least one optical component positioned to interact with the projection beam when the apparatus is in use. Oxygen containing purge gas may also be used to clean surfaces of components different from optical components.

Instead of using the term "maintenance mode," the term "cleaning mode" may be used.

While specific embodiments of the invention have been described above, it will be appreciated that the invention may be practiced otherwise than as described. The description is not intended to limit the invention.

What is claimed is:

1. A lithographic apparatus comprising:
   an illumination system for providing a beam of radiation;
   a support structure for supporting a patterning device, the patterning device serving to impart the beam of radiation with a pattern in its cross-section;
   a substrate table for holding a substrate;
   a projection system for projecting the patterned beam onto a target portion of the substrate; and
   a gas supply system for supplying a purge gas comprising oxygen to a plurality of spaces in said apparatus, the gas supply system being arranged so that the purge gas being supplied to each of the plurality of spaces is a premixed purge gas mixture composed by the gas supply system for each of the plurality of spaces on the basis of a predetermined relationship that relates a desired amount of oxygen in the premixed purge gas mixture to the respective space to which that premixed purge gas mixture is supplied.

2. A lithographic apparatus according to claim 1, wherein the gas supply system is further arranged so that for one of the plurality of spaces, the premixed purge gas mixture is composable on the basis of a time related process parameter.

3. A lithographic apparatus according to claim 1, wherein the lithographic apparatus has a plurality of functional modes, the plurality of functional modes comprising an operative mode and a maintenance mode, the gas supply system further being arranged so that at a particular moment for one of the plurality of spaces, the composition of the premixed purge gas mixture is based on the functional mode the apparatus has adapted to at that particular moment.

4. A lithographic apparatus according to claim 1, wherein the gas supply system comprises a purifier for purifying a supply of a first gas that is mixed with a second gas for obtaining one of the premixed purge gas mixtures.

5. A lithographic apparatus according to claim 1, wherein the gas supply system comprises a mixer for obtaining one of the premixed purge gas mixtures.

6. A lithographic apparatus according to claim 1, wherein the gas supply system comprises one mixer for each space for obtaining the premixed purge gas mixture that is to be supplied to the respective space.

7. A lithographic apparatus according to claim 1, wherein the gas supply system comprises a purge gas remover for removing the purge gas in one of the plurality of spaces.

8. A lithographic apparatus according to claim 1, wherein each space corresponds to an optical component.

9. A lithographic apparatus according to claim 1, wherein each space corresponds to a compartment of the lithographic apparatus.

10. A lithographic apparatus according to claim 1, wherein the gas supply system is arranged to produce ozone as part of one of the premixed purge gas mixtures.

* * * * *